United States Patent [19]

Sunahara et al.

[11] Patent Number: 5,066,620
[45] Date of Patent: Nov. 19, 1991

[54] CONDUCTIVE PASTE COMPOSITIONS AND CERAMIC SUBSTRATES

[75] Inventors: Kazuo Sunahara; Tsuneo Ichimatsu; Yumiko Aoki, all of Yokohama, Japan

[73] Assignee: Asahi Glass Company Ltd., Tokyo, Japan

[21] Appl. No.: 558,451

[22] Filed: Jul. 27, 1990

Related U.S. Application Data

[62] Division of Ser. No. 467,510, Jan. 19, 1990, Pat. No. 4,985,376.

[30] Foreign Application Priority Data

Jan. 31, 1989 [JP] Japan ................................ 1-19830

[51] Int. Cl.$^5$ ............................ C03C 8/02; C03C 8/18; C09D 5/10; B32B 3/00
[52] U.S. Cl. ............................................. 501/21; 501/7; 501/19; 501/54; 106/1.14; 428/209; 428/210
[58] Field of Search .................... 501/17, 22, 54, 7; 106/1.14; 428/209, 210

[56] References Cited

U.S. PATENT DOCUMENTS

| | | | |
|---|---|---|---|
| 4,394,171 | 7/1983 | Nair | 106/1.14 |
| 4,413,061 | 11/1983 | Kumar et al. | 501/7 |
| 4,424,251 | 1/1984 | Sugishita et al. | 428/209 |
| 4,459,166 | 7/1984 | Dietz et al. | 156/89 |
| 4,490,429 | 12/1984 | Tosaki et al. | 428/195 |
| 4,547,625 | 10/1985 | Tosaki et al. | 174/68.5 |
| 4,609,582 | 9/1986 | Joormann et al. | 428/138 |
| 4,636,254 | 1/1987 | Husson, Jr. et al. | 106/1.14 |
| 4,761,325 | 8/1988 | Kurihara et al. | 428/209 |

*Primary Examiner*—William R. Dixon, Jr.
*Assistant Examiner*—Michael Marcheschi
*Attorney, Agent, or Firm*—Oblon, Spivak, McClelland, Maier & Neustadt

[57] ABSTRACT

A surface conductive paste composition to be applied to the surface of a green sheet for a cermaic substrate or to the surface of a ceramic substrate after being fired and to be then fired, the solid content of which has a composition comprising from 80 to 99.9% by weight of Au powder, from 0.1 to 20% by weight of crystallized glass frit and from 0 to 19.9% by weight of non-crystallized glas frit, provided that the total of the crystallized glass frit and the non-crystallized glass frit is at most 20% by weight, and which has a lead compound powder incorporated in an amount of from 0 to 5% by weight based on the total amount of said composition.

8 Claims, No Drawings

CONDUCTIVE PASTE COMPOSITIONS AND CERAMIC SUBSTRATES

This is a division of application Ser. No. 07/467,510 filed on Jan. 19, 1990, now U.S. Pat. No. 4,985,376.

BACKGROUND OF THE INVENTION

1. Field of the Invention

The present invention relates to conductive paste compositions and ceramic substrates. More particularly, the present invention relates to application of a conductive paste composition comprising gold powder, crystallized glass frit, etc. to a ceramic substrate to obtain a highly reliable ceramic substrate, whereby formation of cracks is minimized.

2. Discussion of Background

Gold-containing conductive pastes for ceramic substrates which have been practically employed, are designed so that they are applied on ceramic substrates made of e.g. alumina, which have been fired and solidified beforehand, and then they are fired. Therefore, they have problems such that when they are printed on green sheets and fired simultaneously therewith, cracking or peeling is likely to result in the formed conductors, or the glass frit contained in the pastes tends to cover and glaze the conductor surface, whereby the solderability of the conductors tends to be poor.

Further, glass frit contained in the conductive pastes is likely to be softened prior to the complete decomposition of an organic binder in the green sheets and thus hinder the dispersion of the decomposed gas, whereby there will be a problem of blistering i.e. a phenomenon wherein the conductor surface swells like a balloon by the pressure of the decomposed gas, or a drawback that the adhesion of the conductors to the ceramic substrates tends to be poor.

Further, when the conventional conductive pastes are used as internal conductors of multi-layered ceramic substrates, it is likely that glass frit contained in the conductive pastes tends to glaze before the complete decomposition of the organic binder and thus hinder the dispersion of the decomposition gas, whereby blistering i.e. a phenomenon wherein the multi-layered ceramic substrate on the conductor swells like a balloon, is likely to take place. Further, there is a problem that the adhesion between the conductor and the multi-layered ceramic substrate is inadequate, whereby there will be delamination i.e. a phenomenon in which a void space is formed at the interface between the conductor and the insulating layer of the multi-layered ceramic substrate.

SUMMARY OF THE INVENTION

It is a principal object of the present invention to provide a conductive paste composition comprising gold powder, crystallized glass frit, etc., whereby when it is used for a ceramic substrate, cracking scarcely forms in the conductor, and to provide a ceramic substrate wherein such a conductive paste composition is employed.

The present inventors have found that formation of cracks in the conductor can be minimized by using a conductive paste comprising gold powder, crystallized glass frit, etc. wherein the solid content has a certain specific composition, for a ceramic substrate, and have succeeded in producing a highly reliable ceramic substrate.

The present invention provides a surface conductive paste composition to be applied to the surface of a green sheet for a ceramic substrate or to the surface of a ceramic substrate after being fired and to be then fired, the solid content of which has a composition comprising from 80 to 99.9% by weight of Au powder, from 0.1 to 20% by weight of crystallized glass frit and from 0 to 19.9% by weight of non-crystallized glass frit, provided that the total of the crystallized glass frit and the non-crystallized glass frit is at most 20% by weight, and which has a lead compound powder incorporated in an amount of from 0 to 5% by weight based on the total amount of said composition.

DETAILED DESCRIPTION OF THE PREFERRED EMBODIMENTS

The present invention is concerned with a surface conductive paste composition and an internal conductive paste composition for ceramic substrates which are used primarily for high frequency and for which high reliability is required. It is thereby intended to form a conductor having high reliability and an electric resistance lower than such conductor as silver (Ag), silver-palladium (Pd) or copper (Cu).

In this specification, "%" means "% by weight" unless otherwise specified.

Firstly, the surface conductive paste will be described.

The surface conductive paste of the present invention is to be applied on the surface of a lamination of a plurality of green sheets by e.g. a printing method, to form a conductor such as a pad for mounting various elements thereon and is to be fired together with the green sheets.

The surface conductive paste of the present invention may be applied before or after laminating the green sheets.

As another method, the surface conductive paste of the present invention may be applied e.g. by a printing method to a ceramic substrate which has already been fired and solidified, followed by firing.

This surface conductive paste has a solid content of a composition comprising from 80 to 99.9% of gold (Au) powder, from 0.1 to 20% of crystallized glass frit and from 0 to 19.9% of non-crystallized glass frit, provided that the total of the crystallized glass frit and the non-crystallized glass frit is at most 20% and has a lead compound powder incorporated in an amount of from 0 to 5% based on the total amount of the composition. These components will be described in detail hereinafter.

As is different from an internal conductor, the surface conductor is less frequently used as a normal wiring than being used for a pad for mounting elements. Therefore, the sheet resistance may usually be higher than 5 $m\Omega/\square$ and preferably not higher than 10 $m\Omega/\square$. The following description will be made on this basis.

The Au powder is a component constituting the conductor. If the Au powder is less than 80%, the sheet resistance of the conductor increases, such being undesirable. If it exceeds 99.9%, the amounts of the crystallized glass frit and the non-crystallized glass frit (hereinafter sometimes referred to simply as glass frit) decrease correspondingly, such being undesirable. A preferred range is from 88 to 99%, and a more preferred range is from 94 to 98%.

The crystallized glass frit is the one partially crystallized, and it is crystallized to such an extent that during the firing step, it undergoes no substantial glazing and powder of glass frit can be ascertained.

If the crystallinity of such crystallized glass frit is represented by a numerical value, glass frit having at least 30% crystallized is suitable. If the crystallinity of the crystallized glass frit is less than 30%, the crystallized glass frit tends to undergo glazing during the firing step, whereby blistering is likely to take place due to the remaining gas formed by the decomposition of the organic binder, or cracks are likely to form in the conductor. Further, due to the glazing, the solderability of the conductor tends to be poor.

As mentioned above, the surface conductor usually employed has a resistance of from 5 to 10 m$\Omega$/$\square$. If the content of the crystallized glass frit is less than 0.1%, the adhesion between the conductor and the ceramic insulating layer tends to be poor. On the other hand, if it exceeds 20%, the sheet resistance of the conductor tends to increase. A preferred range is from 1 to 12%, and a more preferred range is from 2 to 6%. The crystals of the crystallized glass frit are not particularly limited, so long as they have a melting point higher than the firing temperature of the surface conductive paste and the green sheets. However, if the glass frit is the one obtained by crystallizing a glass frit having the same or substantially the same composition as the glass frit in green sheets, the characteristics of the thermal expansion coefficient will be substantially the same with the ceramic insulating layer formed by firing the green sheets, such being undesirable.

Such crystallized glass frit may be prepared, for example, as follows.

Glass frit of a $SiO_2$—$Al_2O_3$—$B_2O_3$—$BaO$—$PbO$ system and crystal nuclei are mixed and fired at a temperature of from 600° to 1000° C. for crystallization. Then, the crystallized product is pulverized to obtain crystallized glass frit. As the crystal nuclei at least one of $Al_2O_3$, $TiO_2$, $2Al_2O_3.B_2O_3$ and $BaAl_2Si_2O_8$, is used. The amount of such crystal nuclei is usually within a range of from 5 to 75% based on the total amount of crystallized glass frit.

The material of such crystal nuclei is preferably $2Al_2O_3.B_2O_3$ and $Al_2O_3$ which are crystallizable at a relatively low temperature at a level of about 700° C. Particularly preferred is $2Al_2O_3.B_2O_3$ which is crystallizable at a temperature of about 600° C. or higher. Other materials such as $TiO_2$ and $BaAl_2Si_2O_8$ have a high crystallization temperature at a level of at least about 800° C. Further, when $Al_2O_3$ is used, crystals having a particle size of not higher than 0.5 $\mu$m can readily be crystallized, such being desirable.

In the frit thus prepared, crystals of e.g. $BaAl_2Si_2O_8$ or $2Al_2O_3.B_2O_3$ are precipitated.

When added in an amount of from 0 to 5%, the lead compound powder of the present invention serves to improve the adhesive strength of the conductor to the ceramic substrate and to prevent defects such as cracking or peeling of the conductor.

If the amount of the lead compound powder exceeds 5%, cracking or peeling is likely to form in the conductor, and the solderability tends to be poor, such being undesirable. A preferred range is from 0.05 to 3%, and a more preferred range is from 0.4 to 1.5%.

There is no particular restriction as to the lead compound powder of the present invention so long as it serves to improve the adhesive strength of the conductor to the ceramic substrate, and it is an oxide compound powder of lead with other metal. However, it is preferably at least one member selected from the group consisting of $PbTiO_3$, $Pb(Ti,Zr)O_3$, $PbNb_2O_6$, $PbTa_2O_6$ and $PbZrO_3$ with a view to excellent adhesion. Among them, $PbNb_2O_6$ is preferred, since it scarcely impairs the solderability.

The non-crystallized glass frit is non-crystalline. It is not an essential component, but may be added for good productivity. If the non-crystallized glass frit exceeds 19.9% or the total of the crystallized glass frit and the non-crystallized glass frit exceeds 20%, the sheet resistance of the conductor tends to increase, such being undesirable. A preferred range of the non-crystallized glass frit is from 0 to 11%, and a more preferred range is from 0 to 4%. Further, a preferred range of the total of the crystallized glass frit and the non-crystallized glass frit is at most 12%, and a more preferred range is at most 6%.

The above-mentioned preferred range of the surface conductive paste composition of the present invention is as follows. Namely, the solid content has a composition comprising from 88 to 99% of Au powder, from 1 to 12% of crystallized glass frit and from 0 to 11% of non-crystallized glass frit, provided that the total of the crystallized glass frit and the non-crystallized glass frit is at most 12%, and a lead compound powder is incorporated in an amount of from 0.05 to 3% based on the total amount of the composition.

Further, a particularly preferred range is as follows. The solid content has a composition comprising from 94 to 98% of Au powder, from 2 to 6% of crystallized glass frit and from 0 to 4% of non-crystallized glass frit, provided that the total of the crystallized glass frit and the non-crystallized glass frit is at most 6%, and a lead powder is incorporated in an amount of from 0.4 to 1.5% based on the total amount of the composition.

The surface conductive paste composition of the present invention may also be applied to a single layer ceramic substrate.

Now, the internal conductive paste of the present invention will be described in detail.

The internal conductive paste of the present invention is used in such a manner that a plurality of green sheets are prepared for a multi-layered ceramic substrate, then the internal conductive paste of the present invention is printed on the bonding surfaces of the respective green sheets, then the green sheets are laminated, and the printed internal conductive paste is fired together with the laminated green sheets to form internal conductors which serve primarily as wirings for the above-mentioned multi-layered ceramic substrate.

The internal conductive paste has a composition such that the solid content has a composition comprising from 90 to 99.9% of Au powder, from 0.1 to 10% of crystallized glass frit and from 0 to 9.9% of non-crystallized glass frit, provided that the total of the crystallized glass frit and the non-crystallized glass frit is at most 10%, and a lead compound powder is incorporated in an amount of from 0 to 5% based on the total amount of the composition. The components will be described hereinafter.

As is different from the surface conductor, the internal conductor is used primarily for wiring and therefore its sheet resistance is preferably usually at most 5 m$\Omega$/$\square$. The internal conductor will be described on this basis.

The Au powder is a component constituting the internal conductors. If the Au powder is less than 90%, the sheet resistance of the internal conductors tends to increase, such being undesirable. If the Au powder exceeds 99.9%, the amount of the crystallized glass frit decreases correspondingly, whereby the adhesive strength between the conductor and the ceramic substrate after firing will be low, such being undesirable. A preferred range of the Au powder is from 92 to 99%, and a more preferred range is from 95 to 98%.

As in the case of crystallized glass frit used for the above described surface conductor paste, the crystallized glass frit used for the internal conductive paste is the one partially crystallized, and it is crystallized to such an extent that during the firing step, it undergoes no substantial glazing, and the powder of glass frit can be ascertained.

When the crystallinity of this crystallized glass frit is represented by a numerical value, the glass frit having at least 30% crystallized is suitable.

If the crystallinity of the crystallized glass frit is less than 30%, the glass frit tends to undergo glazing during the firing step, whereby blistering is likely to form due to the remaining gas formed by the decomposition of the organic binder, or cracking is likely to form in the internal conductors, such being undesirable.

If the content of the crystallized glass frit is less than 0.1%, the adhesive strength between the internal conductors and the insulating layers of the multi-layered ceramic substrate tends to be low, and if it exceeds 10%, the sheet resistance of the internal conductors tends to be high, and the strain between the conductors and the insulating layers tends to increase, such being undesirable. A preferred range is from 1 to 8%, and a more preferred range is from 2 to 5%.

The crystals of such crystallized glass frit may be formed as described above.

When incorporated in an amount of from 0.05 to 5%, the lead compound powder serves to improve the adhesive strength of the conductors to the ceramic substrate and to prevent formation of defects such as cracking or peeling of the conductors.

If the amount of the lead compound powder is less than 0.05%, such effects will be little. On the other hand, if the amount exceeds 5%, cracking or peeling of the conductors is likely to take place, and the solderability tends to be poor, such being undesirable. A preferred range is from 0.3 to 2%, and a more preferred range is from 0.5 to 1%.

The lead compound powder of the present invention is not particularly limited so long as it is capable of improving the adhesion of the conductors to the ceramic substrate, and it is an oxide compound powder of lead with other metals. However, it is preferably at least one member selected from the group consisting of $PbTiO_3$, $Pb(Ti,Zr)O_3$, $PbNb_2O_6$, $PbTa_2O_6$ and $PbZrO_3$ with a view to excellent adhesiveness. Among them, $PbNb_2O_6$ is most preferred, since it scarcely impairs the solderability.

The non-crystallized glass frit is as described above. If the non-crystallized glass frit exceeds 9.9% or the total of the crystallized glass frit and the non-crystallized glass frit exceeds 10%, the sheet resistance of the conductors tends to be high, such being undesirable. A preferred range of the non-crystallized glass frit is at most 7%, and a more preferred range is at most 3%. A preferred range of the total of the crystallized glass frit and the non-crystallized glass frit is at most 8%, and a more preferred range is at most 5%.

The above-mentioned preferred range of the internal conductive paste composition of the present invention is as follows. The solid content has a composition comprising from 92 to 99% of Au powder, from 1 to 8% of crystallized glass frit and from 0 to 7% of non-crystallized glass frit, provided that the total of the crystallized glass frit and the non-crystallized glass frit is at most 8%, and the lead compound powder is incorporated in an amount of from 0.3 to 2% based on the total amount of said composition.

A more preferred range of the internal conductive paste composition of the present invention is as follows. The solid content has a composition comprising from 95 to 98% of Au powder, from 2 to 5% of crystallized glass frit and from 0 to 3% of non-crystallized glass frit, provided that the total of the crystallized glass frit and the non-crystallized glass frit is at most 5%, and a lead compound powder is incorporated in an amount of from 0.5 to 1% based on the total amount of the composition.

The surface conductive paste and the internal conductive paste of the present invention contain crystallized glass frit and the amount to be glazed during the firing step is very little. Therefore, a glass coating film is not formed on the conductor surface, whereby a conductor having excellent solderability is obtained.

Further, the gas generated from the organic binder is readily released by the above-mentioned reason, whereby blistering or cracking in the conductor due to the remaining gas scarcely forms.

The functional mechanism of the lead compound powder according to the present invention is not necessarily clearly understood. However, it is considered that the lead compound of the present invention diffuses into the ceramic substrate during the firing to form a strong reaction intermediate at the interface between the conductor formed by the firing of the conductive paste of the present invention and the ceramic substrate, and the adhesive strength between the conductor and the ceramic substrate is thereby improved.

Now, the present invention will be described in further detail with reference to Examples. However, it should be understood that the present invention is by no means restricted to such specific Examples.

EXAMPLE 1

Refractory fillers such as alumina and zircon and glass frit were mixed in the proportions as identified by Nos. 1 to 10 in Table 1, and then pulverized and thoroughly mixed by a pulverization apparatus.

Then, methyl methacrylate as an organic binder, dibutyl phthalate as a plasticizer and toluene as a solvent were added thereto, and the mixtures thereby obtained were kneaded to obtain slurries having a viscosity of from 10000 to 30000 cps. Then, these slurries were formed into sheets having a thickness of about 0.2 mm and then dried at 70° C. for 2 hours to obtain green sheets.

Separately, the surface conductive paste compositions and the internal conductive paste compositions of the present invention are presented in Tables 3 and 4, respectively.

As identified in these Tables, Au powder, crystallized glass frit, non-crystallized glass frit and a lead compound powder were mixed, and organic vehicles such as an ethyl cellulose resin and butylcarbitol, are added thereto to impart the printing properties. The mixture was mixed in an alumina porcelain mortar for one hour and then dispersed by a three roll mill to obtain a conductive paste.

Crystallized glass frit was prepared by pulverizing and mixing in an alumina porcelain mortar the glass frit and crystal nuclei in the proportions as identified by Sample Nos. 1 to 15 and 22 to 36 in Tables 3 and 4, then firing the mixtures at 950° C. for one hour and pulverizing them in an alumina porcelain mortar, and the crystallized glass frit was used after ascertaining by a powder X-ray diffraction method that the crystallinity is at least 30%.

The composition of glass frit used for the preparation of the crystallized glass frit and the non-crystallized glass frit is shown in Table 2.

Conductive pastes thus prepared, were screen-printed on preliminarily prepared green sheets to form paste layers each having a thickness of 20 μm, followed by firing in air at 900° C. for 6 hours to obtain multi-layered ceramic substrates. Among these multi-layered ceramic substrates, those listed in Table 3 wherein surface conductive pastes were used, were evaluated for the presence or absence of defects such as peeling or cracking of the surface conductor, the solderability, the peeling strength indicating the adhesion of the conductor to the multi-layered ceramic substrate and the sheet resistance of the conductor.

The results are shown in Table 3, and the green sheet composition No. as identified in Table 1 used in each test, was also given.

Further, in Table 4, with respect to those wherein the internal conductive pastes were used, the presence or absence of cracking, the presence or absence of blistering, the presence or absence of delamination and the sheet resistance of the conductor, were evaluated, and at the same time, a thermal shock test was conducted which indicates the strain between the substrate and the conductor, and the difference in the heat shock temperatures was evaluated.

The results are shown in Table 4 together with the green sheet composition No. as identified in Table 1 which was used for the test.

EXAMPLE 2

The Au paste prepared in Example 1 (Table 3) was screen-printed on a preliminarily fired 96% $Al_2O_3$ substrate (alumina substrate) to form a paste layer having a thickness of 20 μm, followed by firing in air at 900° C. for one hour to obtain an Au thick film-printed substrate.

This Au thick film-printed substrate was evaluated for the presence of absence of defects such as peeling and cracking of the surface conductor, the solderability, the peeling strength indicating the adhesion of the conductor to the alumina substrate and the sheet resistance of the conductor. The results are shown in Table 5.

As is evident from Table 5, the surface conductive composition of the present invention is free from defects such as peeling or cracking even when applied to a preliminarily fired alumina substrate and showed excellent properties such as a solderability of at least 90%, a peeling strength (initial value) of at least 3.0 kg/2 mm □ and a sheet resistance of at least 10 mΩ/□.

Comparative Examples 16, 17, 37 and 38 in Table 3, Comparative Examples 17, 19, 38 and 40 in Table 4 and Comparative Examples 16, 17, 37 and 38 in Table 5 are Examples wherein non-crystallized glass frit prepared in the same manner as in the preparation of the above-mentioned crystallized glass frit was used except that no crystal nuclei were added.

Methods for evaluating the properties i) Defects such as peeling, cracking, blistering, delamination and deformation:

Inspection of the outer appearance by visual observation.

ii) Solderability: A sample was dipped in a solder comprising 70% of Sn, 18% of Pb and 12% of In at 210±5° C. for 5 seconds, whereupon the proportion of wetted by the solder was evaluated.

iii) Peeling strength test:

A 0.8 Φ tin-plated soft copper wire was soldered to the gold conductor, and the copper wire was bent perpendicularly. Then, the peeling strength was evaluated by a tensile test.

iv) Peeling strength test after being left at a high temperature:

A 0.8 Φ tin-plated copper wire was soldered to the conductor and then left to stand at 150° C. for 1000 hours. Then, the peeling strength was-evaluated by a tensile test.

v) Sheet resistance:

The sheet resistance was measured and evaluated by a digital multimeter manufactured by Y.H.P.

vi) Evaluation of crystallinity:

The integrated intensity of the (111) face of the crystallized phase in the crystallized glass frit was measured by a silicon internal standard method of powder X-ray diffraction analysis, and the integrated intensity ratio of the crystal substance was obtained. The X-rays employed, were $CuK\alpha_1$ rays, and Ni was used as a filter.

vii) Thermal shock test:

On a hot plate, the sample was held at 500° C., 600° C. and at other temperature for 5 minutes and then immersed in water at 25° C., whereupon the presence or absence of cracking was evaluated.

The evaluation was made based on such standards that the one where cracking formed in water when cooled from 500° C., was evaluated to be C., the one where cracking formed in water when cooled from 600° C., was evaluated to be B, and the one where no cracking formed in water when cooled from 600° C., was evaluated to be A.

TABLE 1

| | | Green sheet composition Sample No. | | | | | | | | | |
|---|---|---|---|---|---|---|---|---|---|---|---|
| | | 1 | 2 | 3 | 4 | 5 | 6 | 7 | 8 | 9 | 10 |
| Composition (%) | Alumina | 30 | 60 | 50 | 60 | 70 | 15 | 25 | 35 | 50 | 50 |
| | Zircon | 0 | 0 | 0 | 0 | 0 | 15 | 25 | 35 | 0 | 0 |
| | Glass frit | 70 | 40 | 50 | 40 | 30 | 70 | 50 | 30 | 50 | 50 |
| Glass composition (%) | $SiO_2$ | 40 | 45 | 40 | 40 | 40 | 40 | 25 | 20 | 35 | 30 |
| | $Al_2O_3$ | 15 | 7 | 15 | 15 | 15 | 5 | 10 | 15 | 5 | 20 |
| | MgO + CaO + SrO + BaO | 25 | 3 | 25 | 25 | 20 | 25 | 25 | 15 | 5 | 5 |
| | PbO | 10 | 40 | 10 | 10 | 15 | 20 | 30 | 40 | 50 | 40 |

TABLE 1-continued

| | Green sheet composition Sample No. | | | | | | | | | |
|---|---|---|---|---|---|---|---|---|---|---|
| | 1 | 2 | 3 | 4 | 5 | 6 | 7 | 8 | 9 | 10 |
| $B_2O_3$ | 10 | 5 | 10 | 10 | 10 | 10 | 10 | 10 | 5 | 5 |

TABLE 2

| | | Green frit composition Sample No. | | | | | |
|---|---|---|---|---|---|---|---|
| | | 1 | 2 | 3 | 4 | 5 | 6 |
| Glass composition (%) | $SiO_2$ | 40 | 45 | 35 | 45 | 40 | 40 |
| | $Al_2O_3$ | 15 | 7 | 15 | 15 | 15 | 5 |
| | $MgO + CaO + SrO + BaO$ | 25 | 3 | 5 | 15 | 25 | 25 |
| | PbO | 10 | 40 | 30 | 20 | 8 | 7 |
| | $B_2O_3$ | 10 | 5 | 15 | 5 | 10 | 10 |
| | $TiO_2 + ZrO_2$ | 0 | 0 | 0 | 0 | 2 | 2 |
| | $Li_2O + Na_2O + K_2O$ | 0 | 0 | 0 | 0 | 0 | 1 |

TABLE 3

(Surface conductive pastes)

| | | Examples | | | | |
|---|---|---|---|---|---|---|
| | Sample No. | 1 | 2 | 3 | 4 | 5 |
| Comductive paste composition (%) | Au powder | 92 | 95 | 99.9 | 98 | 90 |
| | Crystallized glass frit | 8 | 5 | 0.1 | 2 | 10 |
| | Non-crystallized glass frit | 0 | 0 | 0 | 0 | 0 |
| Lead compound added to the above composition | $PbTiO_3$ | 0 | 0 | 0 | 0 | 0 |
| | $Pb(Ti, Zr)O_3$ | 0 | 0 | 0 | 0 | 0 |
| | $PbNb_2O_6$ | 0 | 0 | 0 | 0 | 0 |
| | $PbTa_2O_6$ | 0 | 0 | 0 | 0 | 0 |
| | $PbZrO_3$ | 0 | 0 | 0 | 0 | 0 |
| Preparation of crystallized glass | Crystal nuclei | | | | | |
| | $Al_2O_3$ | 50 | 0 | 0 | 0 | 30 |
| | $TiO_2$ | 0 | 50 | 0 | 0 | 0 |
| | $2Al_2O_3 \cdot B_2O_3$ | 0 | 0 | 50 | 0 | 20 |
| | $BaAl_2Si_2O_8$ | 0 | 0 | 0 | 50 | 0 |
| | Glass frit Amount | 50 | 50 | 50 | 50 | 50 |
| | Composition No. in Table 2 | 2 | 1 | 1 | 6 | 3 |
| Green sheet composition No. in Table 1 | | 1 | 8 | 6 | 10 | 3 |
| Properties | Defects such as peeling, cracking, etc. | Nil | Nil | Nil | Nil | Nil |
| | Solderability (%) | 96 | 97 | 100 | 100 | 95 |
| | Peeling strength (Initial value) [kg/2 mm□] | 3.5 | 3.5 | 3.2 | 3.5 | 3.6 |
| | Peeling strength (after 1000 hrs) [kg/2 mm□] | 2.5 | 2.6 | 2.4 | 2.6 | 2.5 |
| | Sheet resistance [mΩ/□] | 6.5 | 5.0 | 4.9 | 4.9 | 7.4 |

| | | Examples | | | | |
|---|---|---|---|---|---|---|
| | Sample No. | 6 | 7 | 8 | 9 | 10 |
| Comductive paste composition (%) | Au powder | 80 | 91 | 97 | 85 | 94 |
| | Crystallized glass frit | 20 | 9 | 3 | 15 | 6 |
| | Non-crystallized glass frit | 0 | 0 | 0 | 0 | 0 |
| Lead compound added to the above composition | $PbTiO_3$ | 0 | 0 | 0 | 0 | 0 |
| | $Pb(Ti, Zr)O_3$ | 0 | 0 | 0 | 0 | 0 |
| | $PbNb_2O_6$ | 0 | 0 | 0 | 0 | 0 |
| | $PbTa_2O_6$ | 0 | 0 | 0 | 0 | 0 |
| | $PbZrO_3$ | 0 | 0 | 0 | 0 | 0 |
| Preparation of crystallized glass | Crystal nuclei | | | | | |
| | $Al_2O_3$ | 0 | 30 | 40 | 40 | 50 |
| | $TiO_2$ | 10 | 0 | 0 | 0 | 0 |
| | $2Al_2O_3 \cdot B_2O_3$ | 20 | 5 | 0 | 5 | 10 |
| | $BaAl_2Si_2O_8$ | 30 | 0 | 0 | 5 | 0 |
| | Glass frit Amount | 40 | 65 | 60 | 50 | 40 |
| | Composition No. in Table 2 | 5 | 2 | 2 | 1 | 4 |
| Green sheet composition No. in Table 1 | | 7 | 2 | 2 | 9 | 5 |
| Properties | Defects such as peeling, cracking, etc. | Nil | Nil | Nil | Nil | Nil |
| | Solderability (%) | 90 | 90 | 100 | 93 | 97 |
| | Peeling strength (Initial value) [kg/2 mm□] | 3.7 | 3.6 | 3.5 | 3.6 | 3.5 |
| | Peeling strength (after 1000 hrs) [kg/2 mm□] | 2.5 | 2.5 | 2.6 | 2.5 | 2.6 |

TABLE 3-continued (Surface conductive pastes)

| | Sheet resistance [mΩ/□] | 9.5 | 7.0 | 5.0 | 8.2 | 5.0 |
|---|---|---|---|---|---|---|

| | | Examples | | | | |
|---|---|---|---|---|---|---|
| | Sample No. | 11 | 12 | 13 | 14 | 15 |
| Comductive paste composition (%) | Au powder | 98 | 80 | 87 | 80 | 81 |
| | Crystallized glass frit | 1 | 15 | 3 | 6 | 1 |
| | Non-crystallized glass frit | 1 | 5 | 10 | 14 | 18 |
| Lead compound added to the above composition | $PbTiO_3$ | 0 | 0 | 0 | 0 | 0 |
| | $Pb(Ti, Zr)O_3$ | 0 | 0 | 0 | 0 | 0 |
| | $PbNb_2O_6$ | 0 | 0 | 0 | 0 | 0 |
| | $PbTa_2O_6$ | 0 | 0 | 0 | 0 | 0 |
| | $PbZrO_3$ | 0 | 0 | 0 | 0 | 0 |
| Preparation of crystallized glass | Crystal nuclei | $Al_2O_3$ | 10 | 0 | 30 | 0 | 30 |
| | | $TiO_2$ | 10 | 0 | 0 | 0 | 10 |
| | | $2Al_2O_3 \cdot B_2O_3$ | 0 | 0 | 30 | 40 | 10 |
| | | $BaAl_2Si_2O_8$ | 20 | 50 | 0 | 30 | 50 |
| | Glass frit | Amount | 60 | 50 | 40 | 30 | 20 |
| | | Composition No. in Table 2 | 2 | 3 | 1 | 6 | 4 |
| Green sheet composition No. in Table 1 | | 2 | 2 | 8 | 7 | 1 |
| Properties | Defects such as peeling, cracking, etc. | Nil | Nil | Nil | Nil | Nil |
| | Solderability (%) | 98 | 91 | 93 | 90 | 90 |
| | Peeling strength (Initial value) [kg/2 mm□] | 3.4 | 3.7 | 3.6 | 3.5 | 3.6 |
| | Peeling strength (after 1000 hrs) [kg/2 mm□] | 2.5 | 2.6 | 2.6 | 2.6 | 2.6 |
| | Sheet resistance [mΩ/□] | 5.3 | 8.6 | 8.8 | 9.6 | 9.8 |

| | | Comparative Examples | | | |
|---|---|---|---|---|---|
| | Sample No. | 16 | 17 | 18 | 19 |
| Comductive paste composition (%) | Au powder | 98 | 80 | 78 | 99.95 |
| | Crystallized glass frit | 0 | 0 | 22 | 0.05 |
| | Non-crystallized glass frit | 2 | 20 | 0 | 0 |
| Lead compound added to the above composition | $PbTiO_3$ | 0 | 0 | 0 | 0 |
| | $Pb(Ti, Zr)O_3$ | 0 | 0 | 0 | 0 |
| | $PbNb_2O_6$ | 0 | 0 | 0 | 0 |
| | $PbTa_2O_6$ | 0 | 0 | 0 | 0 |
| | $PbZrO_3$ | 0 | 0 | 0 | 0 |
| Preparation of crystallized glass | Crystal nuclei | $Al_2O_3$ | 0 | 0 | 25 | 50 |
| | | $TiO_2$ | 0 | 0 | 25 | 0 |
| | | $2Al_2O_3 \cdot B_2O_3$ | 0 | 0 | 0 | 0 |
| | | $BaAl_2Si_2O_8$ | 0 | 0 | 0 | 0 |
| | Glass frit | Amount | 0 | 0 | 50 | 50 |
| | | Composition No. in Table 2 | 1 | 1 | 2 | 2 |
| Green sheet composition No. in Table 1 | | 2 | 2 | 2 | 2 |
| Properties | Defects such as peeling, cracking, etc. | Yes | Yes | Nil | Nil |
| | Solderability (%) | 50 | 10 | 86 | 100 |
| | Peeling strength (Initial value) [kg/2 mm□] | 1.2 | 1.9 | 3.8 | 2.1 |
| | Peeling strength (after 1000 hrs) [kg/2 mm□] | 0.7 | 0.5 | 2.4 | 1.2 |
| | Sheet resistance [mΩ/□] | 7.3 | 10.0 | 12.1 | 4.9 |

| | | Comparative Examples | |
|---|---|---|---|
| | Sample No. | 20 | 21 |
| Comductive paste composition (%) | Au powder | 78 | 70 |
| | Crystallized glass frit | 2 | 5 |
| | Non-crystallized glass frit | 20 | 25 |
| Lead compound added to the above composition | $PbTiO_3$ | 0 | 0 |
| | $Pb(Ti, Zr)O_3$ | 0 | 0 |
| | $PbNb_2O_6$ | 0 | 0 |
| | $PbTa_2O_6$ | 0 | 0 |
| | $PbZrO_3$ | 0 | 0 |
| Preparation of crystallized glass | Crystal nuclei | $Al_2O_3$ | 20 | 0 |
| | | $TiO_2$ | 0 | 20 |
| | | $2Al_2O_3 \cdot B_2O_3$ | 0 | 0 |
| | | $BaAl_2Si_2O_8$ | 50 | 50 |
| | Glass | Amount | 30 | 30 |

TABLE 3-continued (Surface conductive pastes)

|  |  |  |  |  |
|---|---|---|---|---|
|  | frit | Composition No. in Table 2 | 3 | 4 |
| Green sheet composition No. in Table 1 |  |  | 2 | 2 |
| Properties | Defects such as peeling, cracking, etc. |  | Nil | Nil |
|  | Solderability (%) |  | 80 | 50 |
|  | Peeling strength (Initial value) [kg/2 mm□] |  | 3.6 | 3.8 |
|  | Peeling strength (after 1000 hrs) [kg/2 mm□] |  | 2.3 | 2.6 |
|  | Sheet resistance [mΩ/□] |  | 15.1 | 19.5 |

|  |  | Examples ||||||
|---|---|---|---|---|---|---|
|  | Sample No. | 22 | 23 | 24 | 25 | 26 |
| Conductive paste composition (%) | Au powder | 92 | 95 | 99.9 | 98 | 90 |
|  | Crystallized glass frit | 8 | 5 | 0.1 | 2 | 10 |
|  | Non-crystallized glass frit | 0 | 0 | 0 | 0 | 0 |
| Lead compound added to the above composition | $PbTiO_3$ | 1 | 0 | 0 | 0 | 0 |
|  | $Pb(Ti, Zr)O_3$ | 0 | 1 | 0 | 0 | 0 |
|  | $PbNb_2O_6$ | 0 | 0 | 0 | 0.5 | 0 |
|  | $PbTa_2O_6$ | 0 | 0 | 1 | 0 | 0 |
|  | $PbZrO_3$ | 0 | 0 | 0 | 0 | 1 |
| Preparation of crystallized glass | Crystal nuclei $Al_2O_3$ | 50 | 0 | 0 | 0 | 30 |
|  | $TiO_2$ | 0 | 50 | 0 | 0 | 0 |
|  | $2Al_2O_3 \cdot B_2O_3$ | 0 | 0 | 50 | 0 | 20 |
|  | $BaAl_2Si_2O_8$ | 0 | 0 | 0 | 50 | 0 |
|  | Glass frit Amount | 50 | 50 | 50 | 50 | 50 |
|  | Composition No. in Table 2 | 2 | 1 | 1 | 6 | 3 |
| Green sheet composition No. in Table 1 |  | 1 | 8 | 6 | 10 | 3 |
| Properties | Defects such as peeling, cracking, etc. | Nil | Nil | Nil | Nil | Nil |
|  | Solderability (%) | 96 | 97 | 100 | 100 | 95 |
|  | Peeling strength (Initial value) [kg/2 mm□] | 4.0 | 4.0 | 3.7 | 3.9 | 4.1 |
|  | Peeling strength (after 1000 hrs) [kg/2 mm□] | 3.0 | 3.1 | 2.9 | 3.0 | 3.0 |
|  | Sheet resistance [mΩ/□] | 6.5 | 5.0 | 4.9 | 4.9 | 7.4 |

|  |  | Examples ||||||
|---|---|---|---|---|---|---|
|  | Sample No. | 27 | 28 | 29 | 30 | 31 |
| Conductive paste composition (%) | Au powder | 80 | 91 | 97 | 85 | 94 |
|  | Crystallized glass frit | 20 | 9 | 3 | 15 | 6 |
|  | Non-crystallized glass frit | 0 | 0 | 0 | 0 | 0 |
| Lead compound added to the above composition | $PbTiO_3$ | 0 | 1.5 | 0 | 1 | 0.05 |
|  | $Pb(Ti, Zr)O_3$ | 0 | 0 | 0.5 | 0 | 0 |
|  | $PbNb_2O_6$ | 0.5 | 0.5 | 0 | 0 | 0 |
|  | $PbTa_2O_6$ | 0.5 | 0 | 0 | 1 | 0 |
|  | $PbZrO_3$ | 0 | 0 | 0.5 | 0 | 0 |
| Preparation of crystallized glass | Crystal nuclei $Al_2O_3$ | 0 | 30 | 40 | 40 | 50 |
|  | $TiO_2$ | 10 | 0 | 0 | 0 | 0 |
|  | $2Al_2O_3 \cdot B_2O_3$ | 20 | 5 | 0 | 5 | 10 |
|  | $BaAl_2Si_2O_8$ | 30 | 0 | 0 | 5 | 0 |
|  | Glass frit Amount | 40 | 65 | 60 | 50 | 40 |
|  | Composition No. in Table 2 | 5 | 2 | 2 | 1 | 4 |
| Green sheet composition No. in Table 1 |  | 7 | 2 | 2 | 9 | 5 |
| Properties | Defects such as peeling, cracking, etc. | Nil | Nil | Nil | Nil | Nil |
|  | Solderability (%) | 90 | 90 | 100 | 93 | 97 |
|  | Peeling strength (Initial value) [kg/2 mm□] | 4.2 | 4.2 | 4.0 | 4.2 | 3.7 |
|  | Peeling strength (after 1000 hrs) [kg/2 mm□] | 3.0 | 3.1 | 3.1 | 3.1 | 2.8 |
|  | Sheet resistance [mΩ/□] | 9.5 | 7.0 | 5.0 | 8.2 | 5.0 |

|  |  | Examples ||||||
|---|---|---|---|---|---|---|
|  | Sample No. | 32 | 33 | 34 | 35 | 36 |
| Conductive paste composition (%) | Au powder | 98 | 80 | 87 | 80 | 81 |
|  | Crystallized glass frit | 1 | 15 | 3 | 6 | 1 |
|  | Non-crystallized glass frit | 1 | 5 | 10 | 14 | 18 |

TABLE 3-continued (Surface conductive pastes)

| | | | | | | |
|---|---|---|---|---|---|---|
| Lead compound added to the above composition | $PbTiO_3$ | 0 | 0 | 0 | 0 | 0.3 |
| | $Pb(Ti, Zr)O_3$ | 0 | 0 | 0 | 0.1 | 0 |
| | $PbNb_2O_6$ | 1 | 0 | 2 | 0 | 0 |
| | $PbTa_2O_6$ | 0 | 3 | 0 | 0 | 0 |
| | $PbZrO_3$ | 0 | 0 | 2 | 0 | 0 |
| Preparation of crystallized glass | Crystal nuclei $Al_2O_3$ | 10 | 0 | 30 | 0 | 30 |
| | $TiO_2$ | 10 | 0 | 0 | 0 | 10 |
| | $2Al_2O_3.B_2O_3$ | 0 | 0 | 30 | 40 | 10 |
| | $BaAl_2Si_2O_8$ | 20 | 50 | 0 | 30 | 30 |
| | Glass frit Amount | 60 | 50 | 40 | 30 | 20 |
| | Composition No. in Table 2 | 2 | 3 | 1 | 6 | 4 |
| Green sheet composition No. in Table 1 | | 2 | 2 | 8 | 7 | 1 |
| Properties | Defects such as peeling, cracking, etc. | Nil | Nil | Nil | Nil | Nil |
| | Solderability (%) | 98 | 91 | 93 | 90 | 90 |
| | Peeling strength (Initial value) [kg/2 mm□] | 3.9 | 4.4 | 4.4 | 3.7 | 3.9 |
| | Peeling strength (after 1000 hrs) [kg/2 mm□] | 3.0 | 3.3 | 3.4 | 2.8 | 2.9 |
| | Sheet resistance [mΩ/□] | 5.3 | 8.6 | 8.8 | 9.6 | 9.8 |

| | | Comparative Examples | | | | |
|---|---|---|---|---|---|---|
| | Sample No. | 37 | 38 | 39 | 40 | 41 |
| Comductive paste composition (%) | Au powder | 98 | 80 | 78 | 99.95 | 70 |
| | Crystallized glass frit | 0 | 0 | 22 | 0.05 | 5 |
| | Non-crystallized glass frit | 2 | 20 | 0 | 0 | 25 |
| Lead compound added to the above composition | $PbTiO_3$ | 0 | 3 | 0 | 0 | 0 |
| | $Pb(Ti, Zr)O_3$ | 0 | 0 | 1 | 5 | 0 |
| | $PbNb_2O_6$ | 0 | 3 | 0 | 0 | 0.5 |
| | $PbTa_2O_6$ | 0.04 | 0 | 1 | 0 | 0.5 |
| | $PbZrO_3$ | 0 | 0 | 0 | 2 | 0 |
| Preparation of crystallized glass | Crystal nuclei $Al_2O_3$ | 0 | 0 | 25 | 50 | 0 |
| | $TiO_2$ | 0 | 0 | 25 | 0 | 20 |
| | $2Al_2O_3.B_2O_3$ | 0 | 0 | 0 | 0 | 0 |
| | $BaAl_2Si_2O_8$ | 0 | 0 | 0 | 0 | 50 |
| | Glass frit Amount | 0 | 0 | 50 | 50 | 30 |
| | Composition No. in Table 2 | 1 | 1 | 2 | 2 | 4 |
| Green sheet composition No. in Table 1 | | 2 | 2 | 2 | 2 | 2 |
| Properties | Defects such as peeling, cracking, etc. | Yes | Yes | Nil | Nil | Nil |
| | Solderability (%) | 50 | 10 | 86 | 100 | 50 |
| | Peeling strength (Initial value) [kg/2 mm□] | 1.2 | 1.9 | 4.4 | 2.1 | 4.2 |
| | Peeling strength (after 1000 hrs) [kg/2 mm□] | 0.7 | 0.5 | 2.8 | 1.2 | 3.1 |
| | Sheet resistance [mΩ/□] | 7.3 | 15.2 | 12.1 | 14.9 | 21.5 |

TABLE 4

(Internal conductive pastes)

| | | Examples | | | | | | | | | | | | | | |
|---|---|---|---|---|---|---|---|---|---|---|---|---|---|---|---|---|
| | Sample No. | 1 | 2 | 3 | 4 | 5 | 6 | 7 | 8 | 9 | 10 | 11 | 12 | 13 | 14 | 15 |
| Comductive paste composition (%) | Au powder | 95 | 93 | 97 | 98 | 99.9 | 94 | 96 | 92 | 91 | 90 | 97.5 | 97 | 90 | 92 | 90 |
| | Crystallized glass frit | 5 | 7 | 3 | 2 | 0.1 | 6 | 4 | 8 | 9 | 10 | 2 | 1 | 7 | 2 | 1 |
| | Non-crystallized glass frit | 0 | 0 | 0 | 0 | 0 | 0 | 0 | 0 | 0 | 0 | 0.5 | 2 | 3 | 6 | 9 |
| Lead compound added to the above composition | $PbTiO_3$ | 0 | 0 | 0 | 0 | 0 | 0 | 0 | 0 | 0 | 0 | 0 | 0 | 0 | 0 | 0 |
| | $Pb(Ti, Zr)O_3$ | 0 | 0 | 0 | 0 | 0 | 0 | 0 | 0 | 0 | 0 | 0 | 0 | 0 | 0 | 0 |
| | $PbNb_2O_6$ | 0 | 0 | 0 | 0 | 0 | 0 | 0 | 0 | 0 | 0 | 0 | 0 | 0 | 0 | 0 |
| | $PbTa_2O_6$ | 0 | 0 | 0 | 0 | 0 | 0 | 0 | 0 | 0 | 0 | 0 | 0 | 0 | 0 | 0 |
| | $PbZrO_3$ | 0 | 0 | 0 | 0 | 0 | 0 | 0 | 0 | 0 | 0 | 0 | 0 | 0 | 0 | 0 |
| Preparation of crystallized glass | Crystal nuclei $Al_2O_3$ | 30 | 0 | 30 | 0 | 0 | 10 | 50 | 0 | 40 | 50 | 10 | 0 | 15 | 10 | 0 |
| | $TiO_2$ | 0 | 10 | 0 | 50 | 0 | 0 | 0 | 0 | 0 | 0 | 0 | 15 | 0 | 0 | 10 |
| | $2Al_2O_3.B_2O_3$ | 20 | 20 | 5 | 0 | 50 | 5 | 10 | 0 | 0 | 0 | 30 | 0 | 30 | 50 | 20 |
| | $BaAl_2Si_2O_8$ | 0 | 30 | 0 | 0 | 0 | 5 | 0 | 50 | 0 | 0 | 20 | 35 | 20 | 10 | 50 |
| | Glass frit Amount | 50 | 40 | 65 | 50 | 50 | 80 | 40 | 50 | 60 | 50 | 40 | 50 | 35 | 30 | 20 |
| | Composition No. in Table 2 | 3 | 5 | 2 | 1 | 1 | 1 | 4 | 6 | 2 | 2 | 2 | 2 | 1 | 1 | 1 |
| Green sheet composition No. in Table 1 | | 3 | 7 | 2 | 8 | 6 | 9 | 5 | 8 | 2 | 1 | 2 | 3 | 6 | 1 | 5 |
| Properties | Cracking | Nil | Nil | Nil | Nil | Nil | Nil | Nil | Nil | Nil | Nil | Nil | Nil | Nil | Nil | Nil |

TABLE 4-continued (Internal conductive pastes)

| ties | Blistering (%) | Nil | Nil | Nil | Nil | Nil | Nil | Nil | Nil | Nil | Nil | Nil | Nil | Nil | Nil | Nil |
|---|---|---|---|---|---|---|---|---|---|---|---|---|---|---|---|---|
| | Delamination | Nil | Nil | Nil | Nil | Nil | Nil | Nil | Nil | Nil | Nil | Nil | Nil | Nil | Nil | Nil |
| | Sheet resistance [mΩ/□] | 3.3 | 4.0 | 3.2 | 3.2 | 3.2 | 3.3 | 3.2 | 4.7 | 5.0 | 5.0 | 3.2 | 3.6 | 4.3 | 4.8 | 5.0 |
| | Thermal shock test | A | B | A | A | C | B | A | B | C | C | A | B | B | A | B |

| | | | Comparative Examples | | | | | | Examples | | | | | | | |
|---|---|---|---|---|---|---|---|---|---|---|---|---|---|---|---|---|
| | | Sample No. | 16 | 17 | 18 | 19 | 20 | 21 | 22 | 23 | 24 | 25 | 26 | 27 | 28 | 29 | 30 |
| Comductive paste composition (%) | | Au powder | 99.95 | 85 | 85 | 97 | 88 | 80 | 95 | 93 | 97 | 98 | 99.9 | 94 | 96 | 92 | 91 |
| | | Crystallized glass frit | 0.05 | 0 | 15 | 0 | 2 | 5 | 5 | 7 | 3 | 2 | 0.1 | 6 | 4 | 8 | 9 |
| | | Non-crystallized glass frit | 0 | 15 | 0 | 3 | 10 | 15 | 0 | 0 | 0 | 0 | 0 | 0 | 0 | 0 | 0 |
| Lead compound added to the above composition | | $PbTiO_3$ | 0 | 0 | 0 | 0 | 0 | 0 | 1 | 0 | 0 | 0 | 0 | 0 | 0 | 1.5 | 0 |
| | | $Pb(Ti, Zr)O_3$ | 0 | 0 | 0 | 0 | 0 | 0 | 0 | 1 | 0 | 0 | 0 | 0 | 0 | 0 | 0.5 |
| | | $PbNb_2O_6$ | 0 | 0 | 0 | 0 | 0 | 0 | 0 | 0 | 0 | 1 | 0.5 | 0 | 0.5 | 0.5 | 0 |
| | | $PbTa_2O_6$ | 0 | 0 | 0 | 0 | 0 | 0 | 0 | 0 | 1 | 0 | 0 | 0 | 0.5 | 0 | 0 |
| | | $PbZrO_3$ | 0 | 0 | 0 | 0 | 0 | 0 | 0 | 0 | 0 | 0 | 0 | 1 | 0 | 0 | 0.5 |
| Preparation of crystallized glass | Crystal nuclei | $Al_2O_3$ | 50 | 0 | 0 | 0 | 20 | 10 | 30 | 0 | 30 | 0 | 0 | 10 | 50 | 0 | 40 |
| | | $TiO_2$ | 0 | 0 | 50 | 0 | 0 | 0 | 0 | 10 | 0 | 50 | 0 | 0 | 0 | 0 | 0 |
| | | $2Al_2O_3 \cdot B_2O_3$ | 0 | 0 | 0 | 0 | 0 | 30 | 20 | 20 | 5 | 0 | 50 | 5 | 10 | 0 | 0 |
| | | $BaAl_2Si_2O_8$ | 0 | 0 | 0 | 0 | 30 | 30 | 0 | 30 | 0 | 0 | 0 | 5 | 0 | 50 | 0 |
| | Glass frit | Amount | 50 | 0 | 50 | 0 | 50 | 30 | 50 | 40 | 65 | 50 | 50 | 80 | 40 | 50 | 60 |
| | | Composition No. in Table 2 | 1 | 1 | 2 | 2 | 1 | 2 | 3 | 5 | 2 | 1 | 1 | 1 | 4 | 6 | 2 |
| Green sheet composition No. in Table 1 | | | 2 | 1 | 2 | 1 | 2 | 1 | 3 | 7 | 2 | 8 | 6 | 9 | 5 | 8 | 2 |
| Properties | Cracking | | Nil | Yes | Nil | Yes | Nil | Nil | Nil | Nil | Nil | Nil | Nil | Nil | Nil | Nil | Nil |
| | Blistering (%) | | Nil | Yes | Nil | Yes | Nil | Nil | Nil | Nil | Nil | Nil | Nil | Nil | Nil | Nil | Nil |
| | Delamination | | Nil | Yes | Nil | Yes | Nil | Nil | Nil | Nil | Nil | Nil | Nil | Nil | Nil | Nil | Nil |
| | Sheet resistance [mΩ/□] | | 3.2 | 15.3 | 9.2 | 8.9 | 14.8 | 23.2 | 3.3 | 4.0 | 3.2 | 3.2 | 3.2 | 3.3 | 3.2 | 4.7 | 5.0 |
| | Thermal shock test | | C | — | C | — | C | C | A | B | A | A | C | B | A | B | C |

| | | | Examples | | | | | | Comparative Examples | | | | |
|---|---|---|---|---|---|---|---|---|---|---|---|---|---|
| | | | 31 | 32 | 33 | 34 | 35 | 36 | 37 | 38 | 39 | 40 | 41 |
| Comductive paste composition (%) | | Au powder | 90 | 97.5 | 97 | 90 | 92 | 90 | 99.95 | 85 | 85 | 97 | 80 |
| | | Crystallized glass frit | 10 | 2 | 1 | 7 | 2 | 1 | 0.05 | 0 | 15 | 0 | 5 |
| | | Non-crystallized glass frit | 0 | 0.5 | 2 | 3 | 6 | 9 | 0 | 15 | 0 | 3 | 15 |
| Lead compound added to the above composition | | $PbTiO_3$ | 1 | 0.05 | 0 | 0 | 0 | 0 | 0 | 3 | 0 | 0 | 0 |
| | | $Pb(Ti, Zr)O_3$ | 0 | 0 | 0 | 0 | 0 | 0.1 | 0 | 0 | 1 | 5 | 0 |
| | | $PbNb_2O_6$ | 0 | 0 | 0.3 | 0 | 2 | 0 | 0 | 3 | 0 | 0 | 0.5 |
| | | $PbTa_2O_6$ | 1 | 0 | 0 | 3 | 0 | 0 | 0.04 | 0 | 1 | 0 | 0.5 |
| | | $PbZrO_3$ | 0 | 0 | 0 | 0 | 2 | 0 | 0 | 0 | 0 | 2 | 0 |
| Preparation of crystallized glass | Crystal nuclei | $Al_2O_3$ | 50 | 10 | 0 | 15 | 10 | 0 | 50 | 0 | 0 | 0 | 10 |
| | | $TiO_2$ | 0 | 0 | 15 | 0 | 0 | 10 | 0 | 0 | 50 | 0 | 0 |
| | | $2Al_2O_3 \cdot B_2O_3$ | 0 | 30 | 0 | 30 | 50 | 20 | 0 | 0 | 0 | 0 | 30 |
| | | $BaAl_2Si_2O_8$ | 0 | 20 | 35 | 20 | 10 | 50 | 0 | 0 | 0 | 0 | 30 |
| | Glass frit | Amount | 50 | 40 | 50 | 35 | 30 | 20 | 50 | 0 | 50 | 0 | 30 |
| | | Composition No. in Table 2 | 2 | 2 | 2 | 1 | 1 | 1 | 1 | 1 | 2 | 2 | 1 |
| Green sheet composition No. in Table 1 | | | 1 | 2 | 3 | 6 | 1 | 5 | 2 | 1 | 2 | 1 | 2 |
| Properties | Cracking | | Nil | Nil | Nil | Nil | Nil | Nil | Nil | Yes | Nil | Yes | Nil |
| | Blistering (%) | | Nil | Nil | Nil | Nil | Nil | Nil | Nil | Yes | Nil | Yes | Nil |
| | Delamination | | Nil | Nil | Nil | Nil | Nil | Nil | Nil | Yes | Nil | Yes | Nil |
| | Sheet resistance [mΩ/□] | | 5.0 | 3.2 | 3.6 | 4.3 | 4.8 | 5.0 | 3.2 | 15.3 | 9.2 | 8.9 | 23.2 |
| | Thermal shock test | | C | A | B | B | A | B | C | — | C | — | C |

TABLE 5

| | | | Examples | | | | | | | | | | | | | | |
|---|---|---|---|---|---|---|---|---|---|---|---|---|---|---|---|---|
| | | Sample No. | 1 | 2 | 3 | 4 | 5 | 6 | 7 | 8 | 9 | 10 | 11 | 12 | 13 | 14 | 15 |
| Comductive paste composition (%) | | Au powder | 92 | 95 | 99.9 | 98 | 90 | 80 | 91 | 97 | 85 | 94 | 98 | 80 | 87 | 80 | 81 |
| | | Crystallized glass frit | 8 | 5 | 0.1 | 2 | 10 | 20 | 9 | 3 | 15 | 6 | 1 | 15 | 3 | 6 | 1 |
| | | Non-crystallized glass frit | 0 | 0 | 0 | 0 | 0 | 0 | 0 | 0 | 0 | 0 | 1 | 5 | 10 | 14 | 18 |
| Lead compound added to the above composition | | $PbTiO_3$ | 0 | 0 | 0 | 0 | 0 | 0 | 0 | 0 | 0 | 0 | 0 | 0 | 0 | 0 | 0 |
| | | $Pb(Ti, Zr)O_3$ | 0 | 0 | 0 | 0 | 0 | 0 | 0 | 0 | 0 | 0 | 0 | 0 | 0 | 0 | 0 |
| | | $PbNb_2O_6$ | 0 | 0 | 0 | 0 | 0 | 0 | 0 | 0 | 0 | 0 | 0 | 0 | 0 | 0 | 0 |
| | | $PbTa_2O_6$ | 0 | 0 | 0 | 0 | 0 | 0 | 0 | 0 | 0 | 0 | 0 | 0 | 0 | 0 | 0 |
| | | $PbZrO_3$ | 0 | 0 | 0 | 0 | 0 | 0 | 0 | 0 | 0 | 0 | 0 | 0 | 0 | 0 | 0 |
| Preparation of crystallized glass | Crystal nuclei | $Al_2O_3$ | 50 | 0 | 0 | 0 | 30 | 0 | 30 | 40 | 40 | 50 | 10 | 0 | 30 | 0 | 30 |
| | | $TiO_2$ | 0 | 50 | 0 | 0 | 0 | 10 | 0 | 0 | 0 | 0 | 10 | 0 | 0 | 0 | 10 |
| | | $2Al_2O_3 \cdot B_2O_3$ | 0 | 0 | 50 | 0 | 20 | 20 | 5 | 0 | 5 | 10 | 0 | 0 | 30 | 40 | 10 |
| | | $BaAl_2Si_2O_8$ | 0 | 0 | 0 | 50 | 0 | 30 | 0 | 0 | 5 | 0 | 20 | 50 | 0 | 30 | 30 |
| | Glass frit | Amount | 50 | 50 | 50 | 50 | 50 | 40 | 65 | 60 | 50 | 40 | 60 | 50 | 40 | 30 | 20 |
| | | Composition No. | 2 | 1 | 1 | 6 | 3 | 5 | 2 | 2 | 1 | 4 | 2 | 3 | 1 | 6 | 4 |

TABLE 5-continued

| | | | | | | | | | | | | | | | | |
|---|---|---|---|---|---|---|---|---|---|---|---|---|---|---|---|---|
| Properties | Defects such as peeling, cracking, etc. in Table 2 | Nil | Nil | Nil | Nil | Nil | Nil | Nil | Nil | Nil | Nil | Nil | Nil | Nil | Nil | Nil |
| | Solderability (%) | 98 | 99 | 100 | 100 | 96 | 92 | 96 | 100 | 95 | 98 | 98 | 90 | 91 | 90 | 90 |
| | Peeling strength (Initial value) [kg/2 mm□] | 3.2 | 3.1 | 2.8 | 3.0 | 3.2 | 3.3 | 3.2 | 3.0 | 3.3 | 3.1 | 3.2 | 3.5 | 3.3 | 3.3 | 3.4 |
| | Peeling strength (after 1000 hrs) [kg/2 mm□] | 2.2 | 2.3 | 2.0 | 2.2 | 2.3 | 2.4 | 2.2 | 2.1 | 2.3 | 2.2 | 2.2 | 2.5 | 2.5 | 2.5 | 2.5 |
| | Sheet resistance [mΩ/□] | 6.3 | 4.9 | 4.3 | 4.8 | 7.5 | 9.6 | 7.2 | 4.9 | 8.4 | 4.9 | 6.8 | 8.3 | 8.0 | 9.7 | 9.7 |

| | | Comparative Examples | | | | | | Examples | | | | | |
|---|---|---|---|---|---|---|---|---|---|---|---|---|---|
| | Sample No. | 16 | 17 | 18 | 19 | 20 | 21 | 22 | 23 | 24 | 25 | 26 | 27 |
| Conductive paste composition (%) | Au powder | 98 | 80 | 78 | 99.95 | 78 | 70 | 92 | 95 | 99.9 | 98 | 90 | 80 |
| | Crystallized glass frit | 0 | 0 | 22 | 0.05 | 2 | 5 | 8 | 5 | 0.1 | 2 | 10 | 20 |
| | Non-crystallized glass frit | 2 | 20 | 0 | 0 | 20 | 25 | 0 | 0 | 0 | 0 | 0 | 0 |
| Lead compound added to the above composition | $PbTiO_3$ | 0 | 0 | 0 | 0 | 0 | 0 | 1 | 0 | 0 | 0 | 0 | 0 |
| | $Pb(Ti, Zr)O_3$ | 0 | 0 | 0 | 0 | 0 | 0 | 0 | 1 | 0 | 0 | 0 | 0 |
| | $PbNb_2O_6$ | 0 | 0 | 0 | 0 | 0 | 0 | 0 | 0 | 1 | 0 | 0 | 0.5 |
| | $PbTa_2O_6$ | 0 | 0 | 0 | 0 | 0 | 0 | 0 | 0 | 0 | 1 | 0 | 0 |
| | $PbZrO_3$ | 0 | 0 | 0 | 0 | 0 | 0 | 0 | 0 | 0 | 0 | 1 | 0 |
| Preparation of crystallized glass | Crystal nuclei $Al_2O_3$ | 0 | 0 | 25 | 50 | 20 | 0 | 50 | 0 | 0 | 0 | 30 | 0 |
| | $TiO_2$ | 0 | 0 | 25 | 0 | 0 | 20 | 0 | 50 | 0 | 0 | 0 | 10 |
| | $2Al_2O_3 \cdot B_2O_3$ | 0 | 0 | 0 | 0 | 50 | 0 | 0 | 0 | 50 | 0 | 20 | 20 |
| | $BaAl_2Si_2O_8$ | 0 | 0 | 0 | 0 | 0 | 50 | 0 | 0 | 0 | 50 | 0 | 30 |
| | Glass frit Amount | 0 | 0 | 50 | 50 | 30 | 30 | 50 | 50 | 50 | 50 | 50 | 40 |
| | Composition No. in Table 2 | 1 | 1 | 2 | 2 | 3 | 4 | 2 | 1 | 1 | 6 | 3 | 5 |
| Properties | Defects such as peeling, cracking, etc. | Yes | Yes | Nil | Nil | Nil | Nil | Nil | Nil | Nil | Nil | Nil | Nil |
| | Solderability (%) | 62 | 0 | 86 | 100 | 80 | 60 | 98 | 99 | 100 | 100 | 96 | 92 |
| | Peeling strength (Initial value) [kg/2 mm□] | 1.3 | 2.6 | 3.6 | 2.0 | 3.3 | 3.6 | 3.7 | 3.6 | 3.3 | 3.5 | 3.7 | 3.7 |
| | Peeling strength (after 1000 hrs) [kg/2 mm□] | 0.5 | 0.5 | 2.6 | 1.2 | 2.1 | 2.3 | 2.7 | 2.8 | 2.4 | 2.7 | 2.8 | 2.8 |
| | Sheet resistance [mΩ/□] | 8.9 | 13.4 | 12.6 | 4.9 | 15.8 | 18.8 | 6.3 | 4.9 | 4.3 | 4.8 | 7.5 | 9.6 |

| | | Examples | | | | | | | | | Comparative Examples | | | |
|---|---|---|---|---|---|---|---|---|---|---|---|---|---|---|
| | Sample No. | 28 | 29 | 30 | 31 | 32 | 33 | 34 | 35 | 36 | 37 | 38 | 39 | 40 | 41 |
| Conductive paste composition (%) | Au powder | 91 | 97 | 85 | 94 | 98 | 80 | 87 | 80 | 81 | 98 | 80 | 78 | 99.95 | 70 |
| | Crystallized glass frit | 9 | 3 | 15 | 6 | 1 | 15 | 3 | 6 | 1 | 0 | 0 | 22 | 0.05 | 5 |
| | Non-crystallized glass frit | 0 | 0 | 0 | 0 | 1 | 5 | 10 | 14 | 18 | 2 | 20 | 0 | 0 | 25 |
| Lead compound added to the above composition | $PbTiO_3$ | 0 | 0 | 1.5 | 0 | 0 | 0.5 | 0 | 0 | 0 | 0 | 3 | 0 | 0 | 0 |
| | $Pb(Ti, Zr)O_3$ | 0 | 0 | 0 | 0.5 | 0 | 0 | 0 | 0 | 0.1 | 0 | 0 | 1 | 5 | 0 |
| | $PbNb_2O_6$ | 0 | 0.5 | 0.5 | 0 | 0 | 0 | 0.3 | 0 | 0 | 0 | 3 | 0 | 0 | 0.5 |
| | $PbTa_2O_6$ | 0 | 0.5 | 0 | 0 | 1 | 0 | 0 | 3 | 0 | 0.04 | 0 | 1 | 0 | 0.5 |
| | $PbZrO_3$ | 2 | 0 | 0 | 0.5 | 0 | 0 | 0 | 0 | 0 | 0 | 0 | 0 | 2 | 0 |
| Preparation of crystallized glass | Crystal nuclei $Al_2O_3$ | 30 | 40 | 40 | 50 | 10 | 0 | 30 | 0 | 30 | 0 | 0 | 25 | 50 | 0 |
| | $TiO_2$ | 0 | 0 | 0 | 0 | 10 | 0 | 0 | 0 | 10 | 0 | 0 | 25 | 0 | 20 |
| | $2Al_2O_3 \cdot B_2O_3$ | 5 | 0 | 5 | 10 | 0 | 0 | 30 | 40 | 10 | 0 | 0 | 0 | 0 | 0 |
| | $BaAl_2Si_2O_8$ | 0 | 0 | 5 | 0 | 20 | 50 | 0 | 30 | 30 | 0 | 0 | 0 | 0 | 50 |
| | Glass frit Amount | 65 | 60 | 50 | 40 | 60 | 50 | 40 | 30 | 20 | 0 | 0 | 50 | 50 | 30 |
| | Composition No. in Table 2 | 2 | 2 | 1 | 4 | 2 | 3 | 1 | 6 | 4 | 1 | 1 | 2 | 2 | 4 |
| Properties | Defects such as peeling, cracking, etc. | Nil | Nil | Nil | Nil | Nil | Nil | Nil | Nil | Nil | Nil | Nil | Nil | Nil | Nil |
| | Solderability (%) | 96 | 100 | 95 | 98 | 98 | 90 | 91 | 90 | 90 | 62 | 0 | 86 | 100 | 60 |
| | Peeling strength (Initial value) [kg/2 mm□] | 3.8 | 3.5 | 3.9 | 3.6 | 3.8 | 3.7 | 3.7 | 4.0 | 3.6 | 1.3 | 2.6 | 3.6 | 2.0 | 3.6 |
| | Peeling strength (after 1000 hrs) [kg/2 mm□] | 2.8 | 2.6 | 2.9 | 2.7 | 2.8 | 2.7 | 2.9 | 3.2 | 2.6 | 0.5 | 0.5 | 2.6 | 1.2 | 2.3 |
| | Sheet resistance [mΩ/□] | 7.2 | 4.9 | 8.4 | 4.9 | 6.8 | 8.3 | 8.0 | 9.7 | 9.7 | 8.9 | 14.9 | 12.6 | 10.6 | 18.8 |

The surface conductive paste of the present invention is free from defects such as blistering, cracking or peeling from the surface of the insulating layer of the ceramic substrate, after firing, and excellent in the solderability and the adhesive strength to the ceramic substrate. Further, it showed excellent electrical properties with a sheet resistance of not higher than 10 mΩ/□.

The internal conductive paste of the present invention is not only capable of forming a conductor free from defects such as delamination, blistering or cracking between the layers of a multi-layered ceramic substrate after being fired, but also has excellent electrical properties with a sheet resistance of the conductor being not higher than 5 mΩ/□. Thus, it is suitable as an internal conductive paste for a multi-layered ceramic substrate.

Thus, the industrial value of the present invention is significant.

What is claimed is:

1. A surface conductive paste composition to be applied to the surface of a green sheet for a ceramic substrate or to the surface of a ceramic substrate after being fired and to be then fired, the solid content of which has a composition comprising from 80 to 99.9% by weight of Au powder, from 0.1 to 20% weight of crystallized glass frit and from 0 to 19.9% by weight of non-crystallized glass frit, provided that the total of the crystallized glass frit and the non-crystallized glass frit is at most 20% by weight, and which has a lead compound powder incorporated in an amount of from 0 to 5% by weight based on the total amount of said composition.

2. An internal conductive paste composition to be used for a multi-layered ceramic substrate, the solid content of which has a composition comprising from 90 to 99.9% of Au powder, from 0.1 to 10% by weight of crystallized glass frit and from 0 to 9.9% by weight of non-crystallized glass frit, provided that the total of the crystallized glass frit and the non-crystallized glass frit is at most 10% by weight, and which has a lead compound powder incorporated in an amount of from 0 to 5% by weight based on the total amount of said composition.

3. A fired ceramic substrate employing at least one of a surface conductive paste composition applied to the surface of a green sheet for a ceramic substrate or to the surface of a ceramic substrate after being fired and then fired, the solid content of which has a composition comprising from 80 to 99.9% by weight of Au powder, from 0.1 to 20% by weight of crystallized glass frit and from 0 to 19.9% by weight of non-crystallized glass frit, provided that the total of the crystallized glass frit and the non-crystallized glass frit is at most 20% by weight, and which has a lead compound powder incorporated in an amount of from 0 to 5% by weight based on the total amount of said composition, and an internal conductive paste composition to be used for a multi-layered ceramic substrate, the solid content of which has a composition comprising from 90 to 99.9% of Au powder, from 0.1 to 10% by weight of crystallized glass frit and from 0 to 9.9% by weight of non-crystallized glass frit, provided that the total of the crystallized glass frit and the non-crystallized glass frit is at most 10% by weight, and which has a lead compound powder incorporated in an amount of from 0 to 5% by weight based on the total amount of said composition.

4. A fired ceramic substrate employing at least one of a surface conductive paste composition applied to the surface of a green sheet for a ceramic substrate or to the surface of a ceramic substrate after being fired and then fired, the solid content of which has a composition comprising from 88 to 99% by weight of Au powder, from 1 to 12% by weight of crystallized glass frit and from 0 to 11% by weight of non-crystallized glass frit, provided that the total of the crystallized glass frit and the non-crystallized glass frit is at most 12% by weight, and which has a lead compound powder incorporated in an amount of from 0.05 to 3% by weight based on the total amount of said composition, and an internal conductive paste composition to be used for a multi-layered ceramic substrate, the solid content of which has a composition comprising from 92 to 99% of Au powder, from 1 to 8% by weight of crystallized glass frit and from 0 to 7% by weight of non-crystallized glass frit, provided that the total of the crystallized glass frit and the non-crystallized glass frit is at most 8% by weight, and which has a lead compound powder incorporated in an amount of from 0.3 to 2% by weight based on the total amount of said composition.

5. The ceramic substrate according to claim 8, wherein the lead compound is at least one member selected from the group consisting of $PbTiO_3$, $Pb(Ti,Zr)O_3$, $PbNb_2O_6$, $PbTa_2O_6$ and $PbZrO_3$.

6. A coated ceramic substrate prepared by applying to what a surface conductive paste composition, the solid content of which has a composition comprising from 80 to 99.9% by weight of Au powder, from 0.1 to 20% by weight of crystallized glass frit and from 0 to 19.9% by weight of non-crystallized glass frit, provided that the total of the crystallized glass frit and the non-crystallized glass frit is at most 20% by weight, and which has a lead compound powder incorporated in an amount of from 0 to 5% by weight based on the total amount of said composition, to the surface of a green sheet of a ceramic substrate or to the surface of a ceramic substrate after being fired, followed by firing.

7. A coated ceramic substrate prepared by applying a surface conductive paste composition, the solid content of which has a composition comprising from 88 to 99% by weight of Au powder, from 1 to 12% by weight of crystallized glass frit and from 0 to 11% by weight of non-crystallized glass frit, provided that the total of the crystallized glass frit and the non-crystallized glass frit is at most 12% by weight, and which has a lead compound powder incorporated in an amount of from 0.05 to 3% by weight based on the total amount of said composition, to the surface of a green sheet for a ceramic substrate or to the surface of a ceramic substrate after being fired, followed by firing.

8. A coated ceramic substrate according to claim 7, wherein the lead compound powder is at least one member selected from the group consisting of $PbTiO_3$, $Pb(Ti,Zr)O_3$, $PbNb_2O_6$, $PbTa_2O_6$ and $PbZrO_3$.

* * * * *